(12) United States Patent
Chen et al.

(10) Patent No.: US 12,328,138 B2
(45) Date of Patent: Jun. 10, 2025

(54) HIGH FREQUENCY TRANSMITTER AND RECEIVER RADIO FREQUENCY INTERFACE INCLUDING TRANSMIT/RECEIVE SWITCH WITH ELECTROSTATIC DISCHARGE PROTECTION AND BIASING SCHEMES

(71) Applicant: Samsung Electronics Co., Ltd., Gyeonggi-do (KR)

(72) Inventors: Ying Chen, San Jose, CA (US); Tienyu Chang, Sunnyvale, CA (US); Xiaohua Yu, San Jose, CA (US)

(73) Assignee: Samsung Electronics Co., Ltd (KR)

( * ) Notice: Subject to any disclaimer, the term of this patent is extended or adjusted under 35 U.S.C. 154(b) by 321 days.

(21) Appl. No.: 17/864,044

(22) Filed: Jul. 13, 2022

(65) Prior Publication Data
US 2023/0353186 A1 Nov. 2, 2023

Related U.S. Application Data

(60) Provisional application No. 63/336,560, filed on Apr. 29, 2022.

(51) Int. Cl.
*H04B 1/44* (2006.01)
*H03F 3/24* (2006.01)
*H04L 5/14* (2006.01)

(52) U.S. Cl.
CPC ............ *H04B 1/44* (2013.01); *H03F 3/245* (2013.01); *H04L 5/1461* (2013.01); *H03F 2200/294* (2013.01); *H03F 2200/451* (2013.01)

(58) Field of Classification Search
CPC ..... H04B 1/44; H03F 3/245; H03F 2200/294; H03F 2200/451; H03F 2200/09; H03F 2200/444; H03F 2203/45228; H03F 3/193; H03F 2200/483; H04L 5/1461; H02H 9/005; H03K 17/6871; H03K 17/693
See application file for complete search history.

(56) References Cited

U.S. PATENT DOCUMENTS

| 8,482,889 B2 | 7/2013 | Huang et al. | |
| 10,256,776 B1* | 4/2019 | Mania | H04R 3/00 |
| 11,037,893 B2 | 6/2021 | Wallis et al. | |
| 2006/0158281 A1 | 7/2006 | Garris et al. | |
| 2011/0241967 A1 | 10/2011 | Kaikkonen et al. | |
| 2015/0171754 A1* | 6/2015 | Scibilia | H05B 45/3725 363/21.02 |
| 2015/0333791 A1* | 11/2015 | Anderson | H04B 1/48 455/83 |
| 2021/0044104 A1 | 2/2021 | Domanski et al. | |
| 2021/0194125 A1* | 6/2021 | Bellaouar | H03F 3/195 |
| 2022/0021351 A1 | 1/2022 | Wallis | |

* cited by examiner

*Primary Examiner* — Ayanah S George
(74) *Attorney, Agent, or Firm* — The Farrell Law Firm, P.C.

(57) ABSTRACT

Disclosed is a millimeter-wave transceiver (TRX) interface including a transmitter (TX) front-end, a receiver (RX) front-end, a TX/RX switch disposed in series between the TX front-end and the RX front-end, a TX output transformer disposed between the TX front-end and an input of the TX/RX switch, a first capacitor, and at least two diodes, wherein the first capacitor and the at least two diodes are connected between the TX output transformer and ground.

18 Claims, 12 Drawing Sheets

HIGH FREQUENCY TRANSMITTER AND RECEIVER RADIO FREQUENCY INTERFACE INCLUDING TRANSMIT/RECEIVE SWITCH WITH ELECTROSTATIC DISCHARGE PROTECTION AND BIASING SCHEMES

PRIORITY

This application is based on and claims priority under 35 U.S.C. § 119(e) to U.S. Provisional Application Ser. No. 63/336,560, which was filed in the U.S. Patent and Trademark Office on Apr. 29, 2022, the contents of which are incorporated herein by reference.

FIELD

The disclosure relates generally to radio frequency (RF) transmission, and more particularly, to a millimeter-wave transceiver (TRX) interface in RF transmission.

BACKGROUND

In an RF transceiver (i.e., an RF transmitter (TX) and a receiver (RX) (or TRX), operating at millimeter-wave frequencies of at least 30 gigahertz (GHz)), a shunt inductor is often added on-chip to an RF input/output (I/O) pin that carries millimeter-wave signals to direct current (DC) ground in order to protect electrostatic discharge (ESD) of the millimeter-wave I/O pin. Because the ESD event operates according to a maximum frequency of 1 GHz as compared to millimeter-wave frequencies, the shunt inductor can provide a low-impedance path for ESD current while providing reasonably high impedance at millimeter-wave frequencies. Compared to another conventional approach that uses ESD diodes directly at a millimeter-wave I/O, using the shunt inductor for ESD protection has an advantage of lower RF signal losses at the I/O. However, since the RF I/O pin is connected through a shunt inductor to ground, the DC voltage level of the RF I/O pin is zero Volts (0V). It would be advantageous for positive and negative voltage events to be enabled at the RF I/O for better linearity in the TX and RX.

Figure 1:
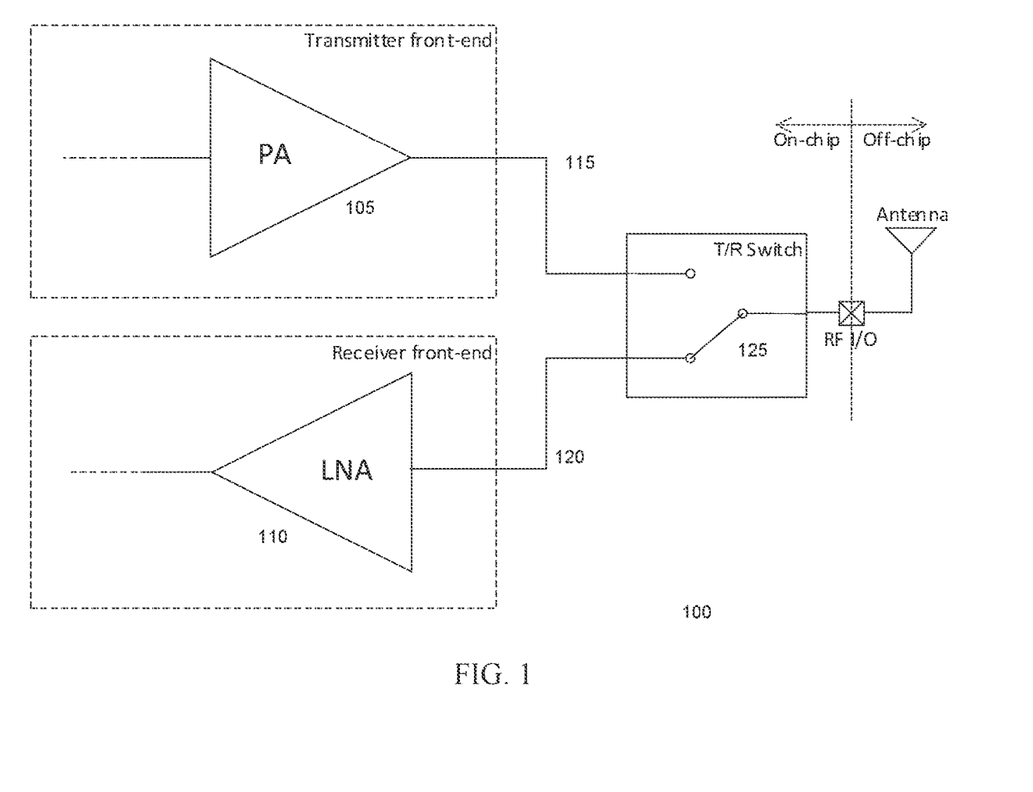
FIG. 1 illustrates an RF transceiver front-end architecture.

FIG. 1 illustrates an RF transceiver front-end architecture 100. In FIG. 1, the TX and the RX share the same RF I/O pin. In FIG. 1, a transmit/receive (T/R) switch 125 at an interface between TX 115 and RX 120 is used to switch between a power amplifier (PA) 105 during transmission and a low-noise amplifier (LNA) 110 during reception in a time-division duplex (TDD) system.

FIGS. 2A, 2B, 2C, and 2D illustrate topologies of a millimeter-wave TX and RX interface to which the disclosure is applied.

Specifically, FIGS. 2A, 2B, 2C and 2D illustrate conventional topologies 200, 201, 202, and 203 of the millimeter-wave TX and RX interface showing the ESD discharge path 215 and 216 with an example of DC bias/control settings. In each illustration, an input matching network (IMN) is disposed at the input of the LNA 210 to transform impedances to the desired value seen by the LNA 210, and an output matching network (OMN) is disposed at the output of the PA 205 to transform impedances to the desired value seen by the PA 205.

Figure 2A:
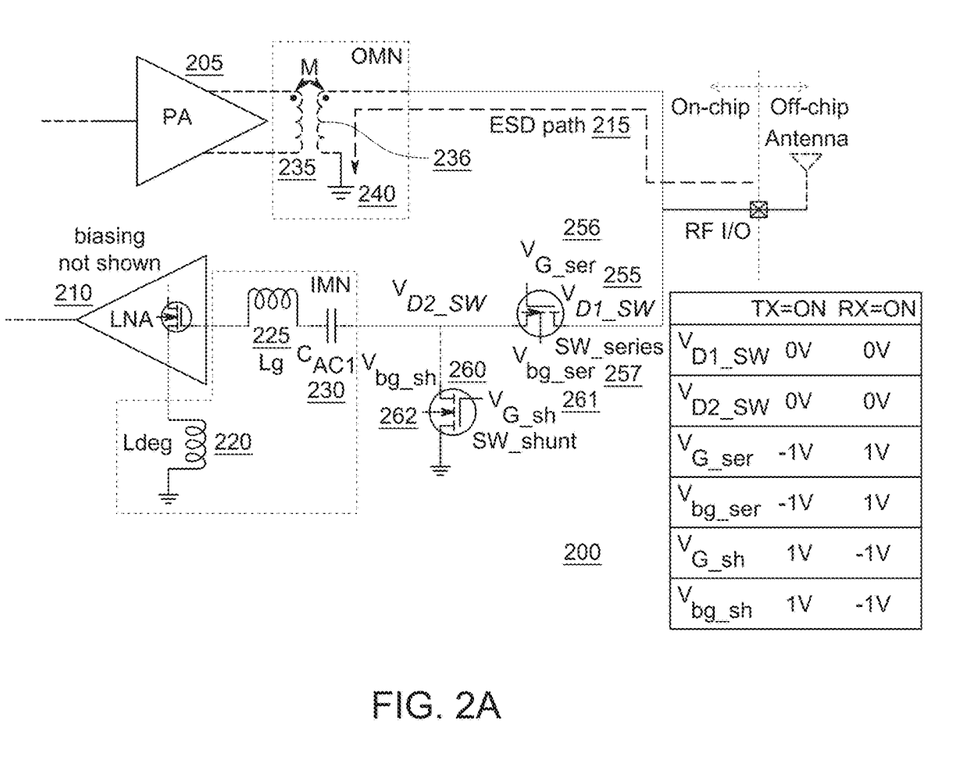
FIGS. 2A, 2B, 2C and 2D illustrate topologies of a millimeter-wave TX and RX interface to which the disclosure is applied.
Figure 2B:
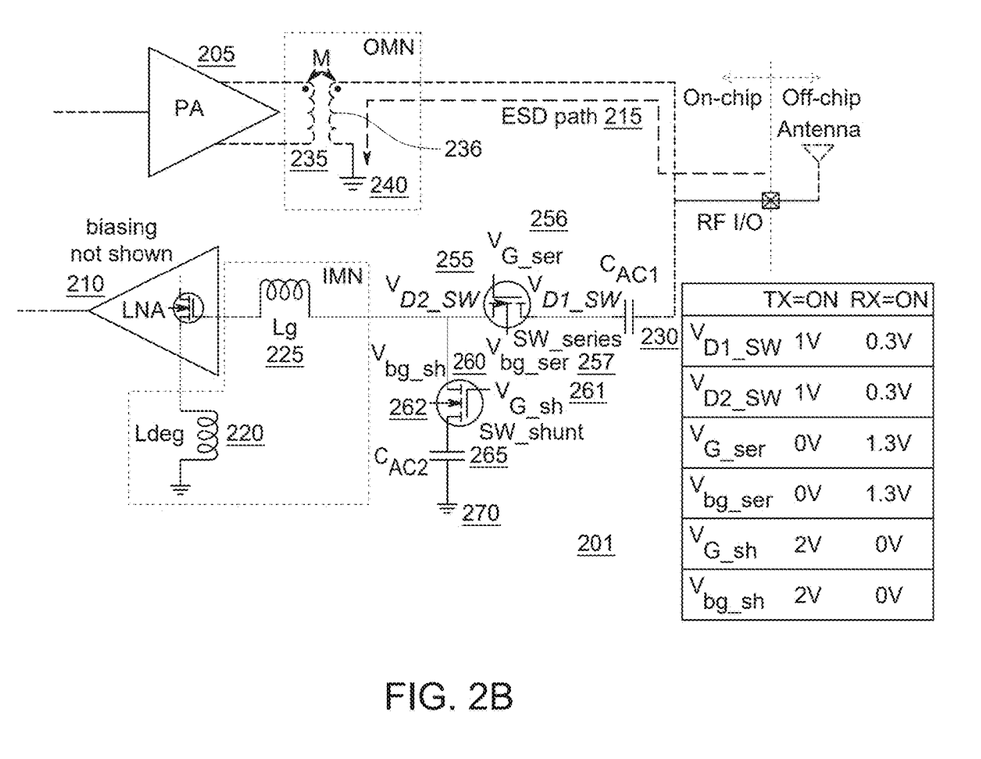
Figure 2C:
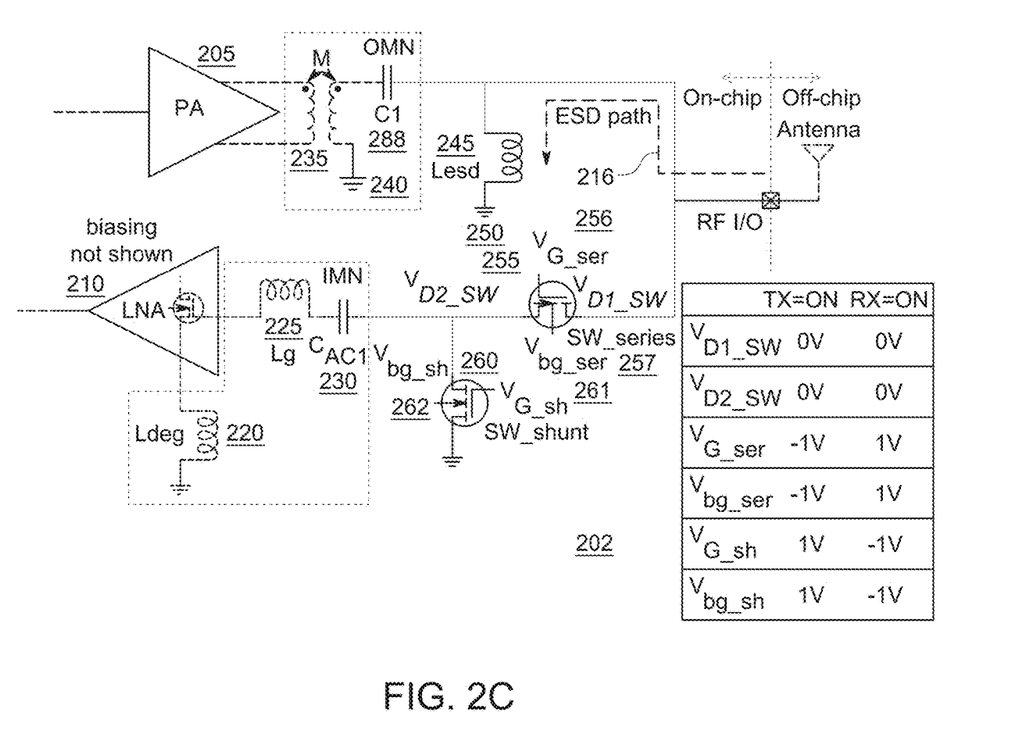
Figure 2D:
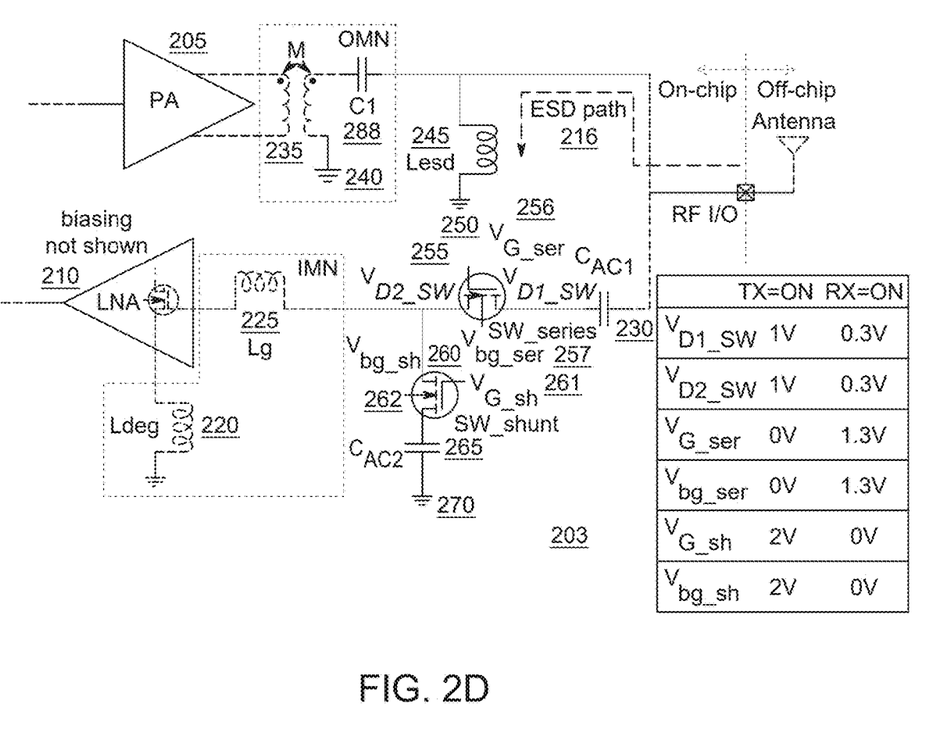

In FIGS. 2A and 2B, the ESD discharge path 215 is through the secondary winding terminal 236 of the output transformer 235 of the PA 205 to ground 240. In FIGS. 2C and 2D, the ESD discharge path 216 is through the shunt inductor ($L_{esd}$) 245 to ground 250. The LNA 210 uses a common-source amplifier with inductor degeneration ($L_{deg}$) 220 and is widely used in modern communication systems due to superior noise figure (NF) performance. In FIGS. 2C and 2D, the OMN of PA 210 uses series capacitor C1 288 to perform impedance transformation, thereby requiring the shunt inductor Lesd 245 to be added to the ESD discharge path 216 for ESD protection.

In order for the gate of the input transistor ($L_g$) 225 of the common-source amplifier to be DC biased, an alternating current (AC) coupling capacitor ($C_{AC1}$) 230 is inserted in series for the RX signal path in front of the gate of the LNA 210.

The topologies in FIGS. 2A and 2C place $C_{AC1}$ 230 between the input of the LNA 210 and the switches 255 and 260. In these topologies, drain and source of the switches 255 and 260 are fixed to 0V.

Such that sufficient linearity for the T/R switch may be achieved during the TX mode, negative voltages may be applied to the gate $V_{G\_ser}$ 256 and back-gate $V_{bg\_ser}$ 257 of the series switch 255 while positive voltages are applied to the gate $V_{G\_sh}$ 261 and back-gate $V_{bg\_sh}$ 262 of the shunt switch 260. During an RX mode, positive voltages may be applied to $V_{G\_ser}$ 256 and $V_{bg\_ser}$ 257 while negative voltages can be applied to $V_{G\_sh}$ 261 and $V_{bg\_sh}$ 262.

The topologies in FIGS. 2B and 2D can provide good linearity without negative voltage biasing. In these topologies, $C_{AC1}$ 230 is connected directly to the RF I/O in front of the series switch 255, and $C_{AC2}$ 265 is added to the output of the shunt switch 260. During TX mode, the drain and source of the switches 255, 260 are set to a positive voltage while $V_{G\_ser}$ 256 and $V_{bg\_ser}$ 257 are set to 0V, and $V_{G\_sh}$ 261 and $V_{bg\_sh}$ 262 are set to a positive voltage that is higher than drain and source voltage.

During an RX mode, the gate of the input transistor 211 of the LNA 210 is DC biased accordingly, which sets the DC voltage level of the drain and source of the switches 255, 260. $V_{G\_ser}$ 256 and $V_{bg\_ser}$ 257 are set higher than this DC voltage level while $V_{G\_sh}$ 261 and $V_{bg\_sh}$ 262 are set to 0V.

The tables in FIGS. 2A, 2B, 2C, and 2D illustrate examples of DC bias/control settings for each embodiment based on the above-discussed method. The actual setting values depend also on the used semiconductor process. For FIGS. 2A and 2C, the drain and source voltages at each of the switches when TX and RX are on is 0V. In order for the switches to be turned off in this instance, the gate and back-gate of the series transistor is placed in a negative voltage in FIGS. 2A and 2C. In this manner, there is a negative voltage between the gate and drain and back-gate and drain of the series transistor, better enabling the switch to turn off. Simultaneously, the shunt switch is turned on during the RX mode by the voltage at the gate and back-gate being set to a positive voltage (e.g., 1V). To turn the shunt switch off, the gate and back-gate are set to negative voltage (e.g., −1V).

$C_{AC1}$ 230 and $C_{AC2}$ 265 are usually designed to be large in size, and therefore, have significant parasitic shunt capacitance to the lossy silicon substrate. However, the degradation on the RF performance by $C_{AC1}$ 230 is much greater than by $C_{AC2}$ 265, because $C_{AC1}$ 230 is in series with the critical signal path, whereas one side of $C_{AC2}$ 265 is grounded 270. The presence of $C_{AC1}$ 230 degrades the NF and gain of the receiver during RX mode, and also reduces output power during TX mode. These performance degradations are due to both the serial resistive loss of the $C_{AC1}$ capacitor and the shunt resistive loss from $C_{AC1}$ to the lossy silicon substrate through the parasitic shunt capacitive coupling. Since these resistive losses are in the critical signal path, they increase the NF and lower the gain of the receiver during RX mode. During TX mode, the impedance looking into the RX from TX/RX junction decreases due to these resistive losses, which results in more transmit signal loss and thus a lower output power.

Additionally, $C_{AC1}$ 230 occupies a large portion of chip area as compared to the switch, resulting in a need for a method and apparatus that modifies the conventional TRX interface to increase consistent power output and improve overall RF performance.

SUMMARY

The present disclosure has been made to address at least the above-mentioned problems and/or disadvantages and to provide at least the advantages described below.

Accordingly, an aspect of the disclosure is to provide a series of new topologies for a millimeter-wave TRX interface including a T/R switch with ESD protection and associated biasing schemes, which remove a $C_{AC1}$ capacitor from a critical signal path, thereby improving RF performance since $C_{AC1}$ degrades the NF and gain of the receiver during the RX mode and reduces output power during the TX mode by virtue of $C_{AC1}$ being in series with the critical signal path and, therefore, not being grounded on either end.

Another aspect of the disclosure is to provide a millimeter-wave TRX interface that increases compactness of a core circuitry in a silicon die area of an interface by removing $C_{AC1}$, which occupies a significant portion of the silicon die area of the TR switch, from said silicon die area. Therefore, a smaller sized chipset and electronic device in which the chipset is disposed can be realized.

In accordance with an aspect of the disclosure, a device is provided, which includes a transmitter (TX) front-end, a receiver (RX) front-end, a TX/RX switch disposed in series between the TX front-end and the RX front-end, a TX output transformer disposed between the TX front-end and an input of the TX/RX switch, a first capacitor, and at least two diodes. The first capacitor and the at least two diodes are connected between the TX output transformer and ground.

In accordance with another aspect of the disclosure, a chipset is provided, which includes a TX front-end, an RX front-end, a TX/RX switch disposed in series between the TX front-end and the RX front-end, a TX output transformer disposed between the TX front-end and an input of the TX/RX switch and including a primary winding terminal and a secondary winding terminal, an alternating current (AC) coupling capacitor, a first diode, and a second diode. The first and second diodes and the AC coupling capacitor are connected between the secondary winding terminal of the TX output transformer and the ground.

BRIEF DESCRIPTION OF THE DRAWINGS

The above and other aspects, features, and advantages of certain embodiment of the present disclosure will be more apparent from the following detailed description taken in conjunction with the accompanying drawings, in which.

DETAILED DESCRIPTION

Embodiments of the present disclosure will be described herein below with reference to the accompanying drawings. However, the embodiments of the disclosure are not limited to the specific embodiments and should be construed as including all modifications, changes, equivalent devices and methods, and/or alternative embodiments of the present disclosure. Descriptions of well-known functions and/or configurations will be omitted for the sake of clarity and conciseness.

The expressions "have," "may have," "include," and "may include" as used herein indicate the presence of corresponding features, such as numerical values, functions, operations, or parts, and do not preclude the presence of additional features. The expressions "A or B," "at least one of A or/and B," or "one or more of A or/and B" as used herein include all possible combinations of items enumerated with them. For example, "A or B," "at least one of A and B," or "at least one of A or B" indicate (1) including at least one A, (2) including at least one B, or (3) including both at least one A and at least one B.

Terms such as "first" and "second" as used herein may modify various elements regardless of an order and/or importance of the corresponding elements, and do not limit the corresponding elements. These terms may be used for the purpose of distinguishing one element from another element. For example, a first user device and a second user device may indicate different user devices regardless of the order or importance. A first element may be referred to as a second element without departing from the scope the disclosure, and similarly, a second element may be referred to as a first element.

When a first element is "operatively or communicatively coupled with/to" or "connected to" another element, such as a second element, the first element may be directly coupled with/to the second element, and there may be an intervening element, such as a third element, between the first and second elements. To the contrary, when the first element is "directly coupled with/to" or "directly connected to" the second element, there is no intervening third element between the first and second elements.

All of the terms used herein including technical or scientific terms have the same meanings as those generally understood by an ordinary skilled person in the related art unless they are defined otherwise. The terms defined in a generally used dictionary should be interpreted as having the same or similar meanings as the contextual meanings of the relevant technology and should not be interpreted as having ideal or exaggerated meanings unless they are clearly defined herein. According to circumstances, even the terms defined in this disclosure should not be interpreted as excluding the embodiments of the disclosure.

Figure 3A:
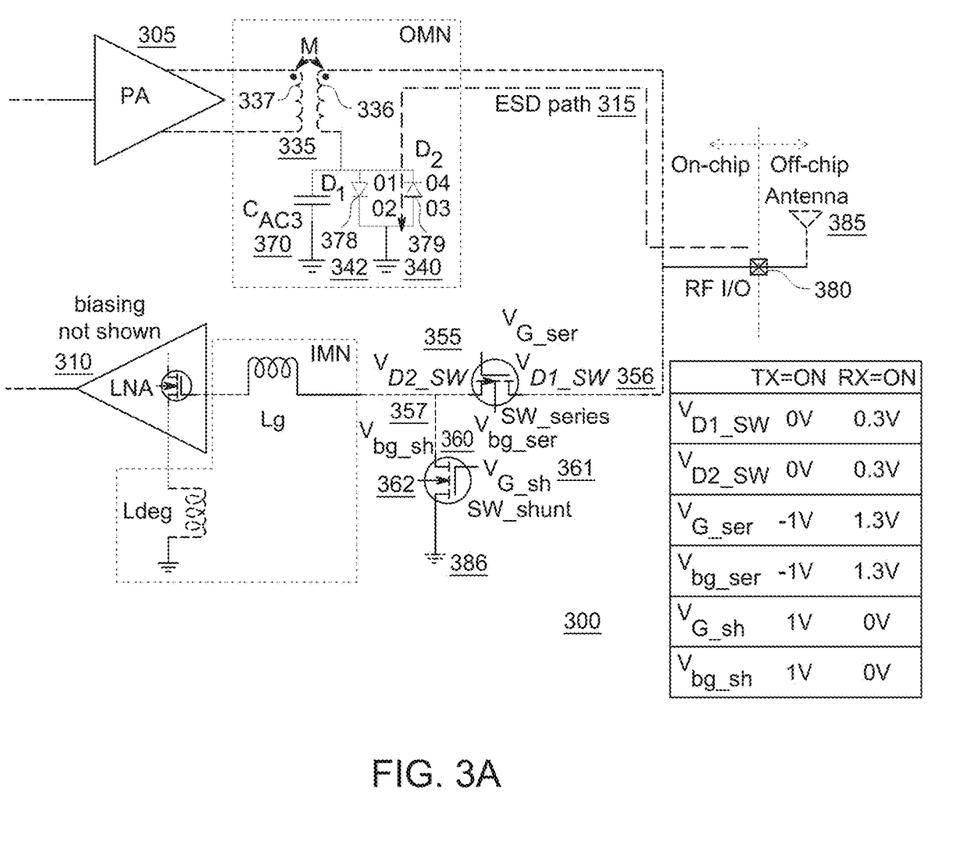
FIG. 3A illustrates a millimeter-wave TRX interface with ESD protection, according to an embodiment.

FIG. 3A illustrates a millimeter-wave TRX interface with ESD protection 300, according to an embodiment. Specifically, FIG. 3A illustrates when negative voltage is used to control the gate and back-gate of a series switch 355. It is noted that the components in FIGS. 3A, 3B and 3C that relate to those described above will not be described in the following, for conciseness.

Figure 3B:
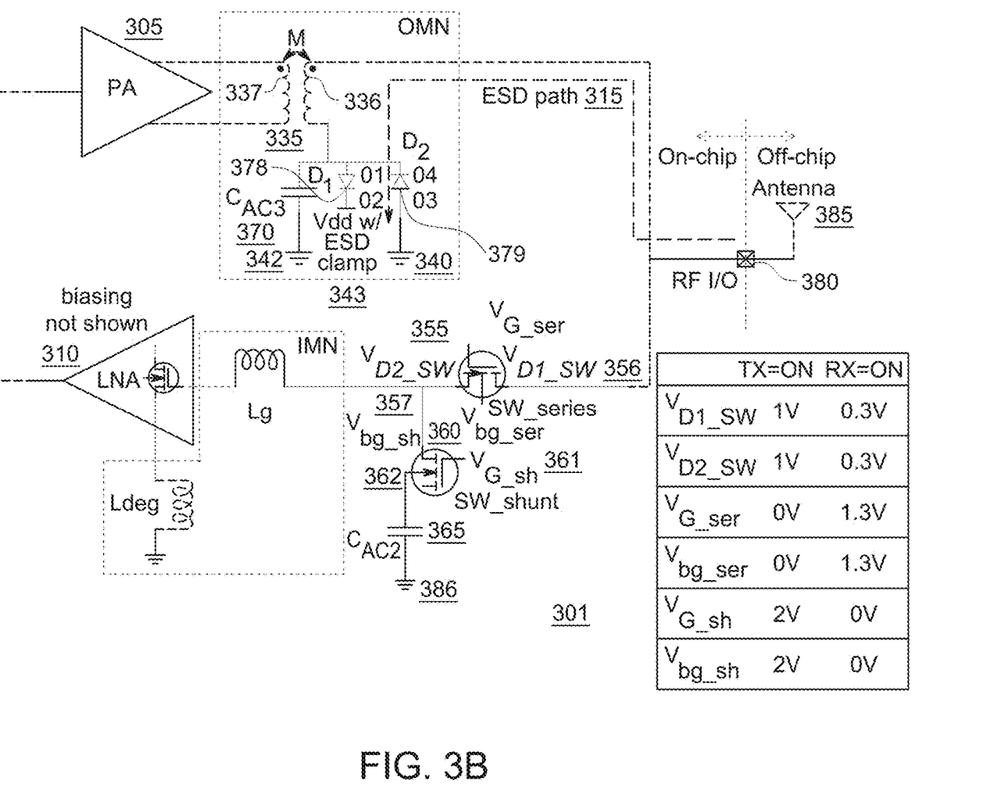
FIG. 3B illustrates a millimeter-wave TRX interface with ESD protection, according to an embodiment.
Figure 3C:
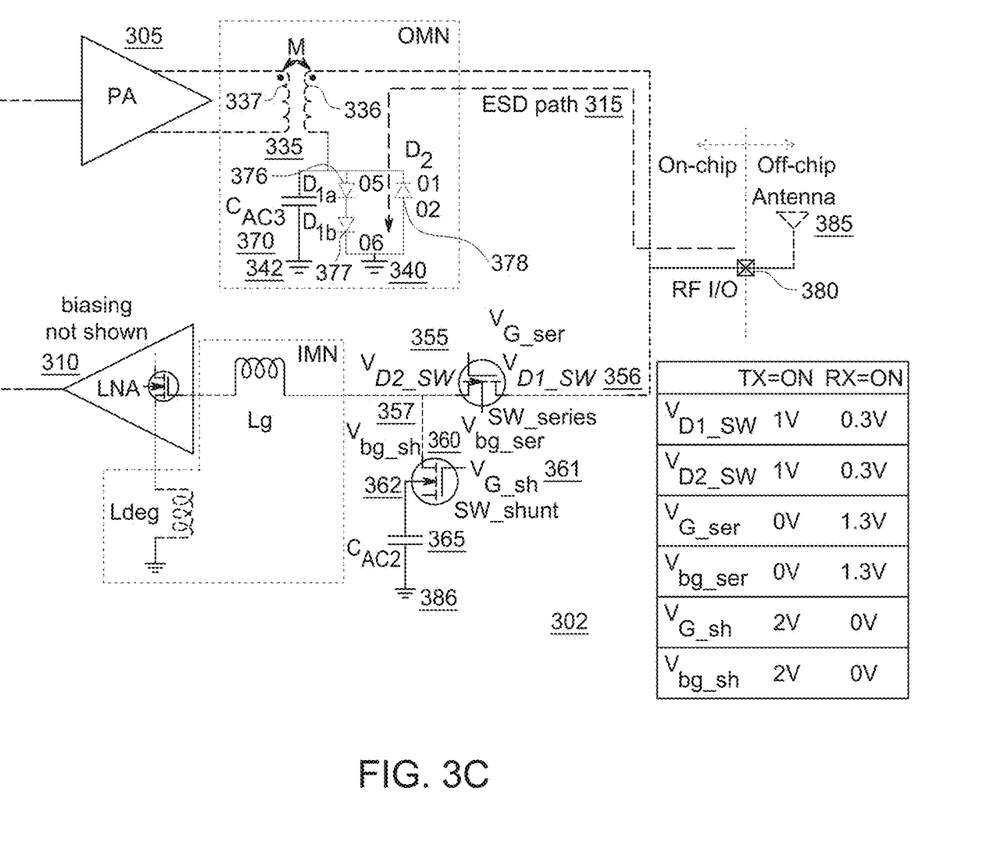
FIG. 3C illustrates a millimeter-wave TRX interface with ESD protection, according to an embodiment.

As illustrated in FIGS. 3A, 3B and 3C, components to the left of RF I/O are on-chip, and an antenna 385 to the right of RF I/O 380 is off-chip. Thus, the components on-chip may be comprised in a chipset installed in an electronic device.

In FIG. 3A, diodes D1 378 and D2 379 and an AC coupling capacitor $C_{AC3}$ 370 are connected between the secondary winding terminal 336 of the TX output transformer 335 (including a primary winding terminal 337 and the secondary winding terminal 336) and the ground 340. D1 378 and D2 379 are connected in such a manner that the anode 01 and the cathode 02 of D1 378 are connected to the cathode 04 and anode 03 of D2 379 respectively. D1 378 and D2 379 provide ESD discharge paths to the ground 340 for both positive and negative ESD voltage events at the RF I/O pin 380.

$C_{AC3}$ 370 is connected in parallel with D1 378 and D2 379 to provide a low impedance to ground 342 at millimeter-wave frequencies. Although the capacitance of $C_{AC3}$ 370 may be large, such as several hundred femtofarads to a few picofarads for 30 GHz to 60 GHz operation, since $C_{AC3}$ 370 is connected to the ground 342 instead of in series to the critical signal path 315, it has negligible impact to the RF performance. Because of the added diode D1 378, the gate of the input transistor 311 of LNA 310 can be biased at a positive voltage that is less than the turn-on voltage of D1 378 (e.g., 0.7V) during RX mode. Therefore, $C_{AC1}$ is omitted from the critical signal path. When negative control voltages are applied to the series switch 355 while drain and source of the switches 355, 360 are set to 0V during TX mode, $C_{AC2}$ can also be omitted. The table in FIG. 3A illustrates the DC bias/control settings.

FIG. 3B illustrates a millimeter-wave TRX interface with ESD protection 301, according to an embodiment. Specifically, FIG. 3B illustrates a variant of the embodiment 300 of FIG. 3A when only positive voltages are used as DC bias/control.

Compared to the embodiment in FIG. 3A, the cathode c of D1 378 is connected to a voltage drain (Vdd) with an ESD clamp protection circuitry 343. VD1_SW 356 and VD2_SW 357 can be biased at a positive voltage less than Vdd plus a turn-on voltage of D1 378. $C_{AC2}$ 365 is connected between the shunt switch 360 and the ground 386, so that the drain and source of the shunt switch 360 can be biased at a positive voltage during TX mode. That is, the shunt switch 360 includes a gate ($V_{G\_sh}$) 361 and a back-gate ($V_{bg\_sh}$) 362 and $C_{AC2}$ 365 is disposed between $V_{bg\_sh}$ 362 and the ground. As described above, $C_{AC2}$ 365 has negligible impact to the RF performance. The table in FIG. 3B illustrates the DC bias/control settings.

FIG. 3C illustrates a millimeter-wave TRX interface with ESD protection 302, according to an embodiment. Specifically, FIG. 3C illustrates a variant of the embodiment 300 of FIG. 3A when only positive voltages are used as DC bias/control.

Referring to FIG. 3C, two diodes D1a 376 and D1b 377 connected in series are used between the secondary winding terminal 336 of the TX output transformer 335 and ground 340.

The anode 05 of D1a 376 and cathode 06 of D1b 377 are connected to cathode 02 and anode 01 of D2 378, respectively. Since two diodes D1a 376 and D1b 377 connected in series are used, VD1_SW 356 and VD2_SW 357 can be biased at a positive voltage less than twice the turn-on voltage of a diode (i.e. ~1.4V). The table in FIG. 3C illustrates the DC bias/control settings.

Figure 3D:
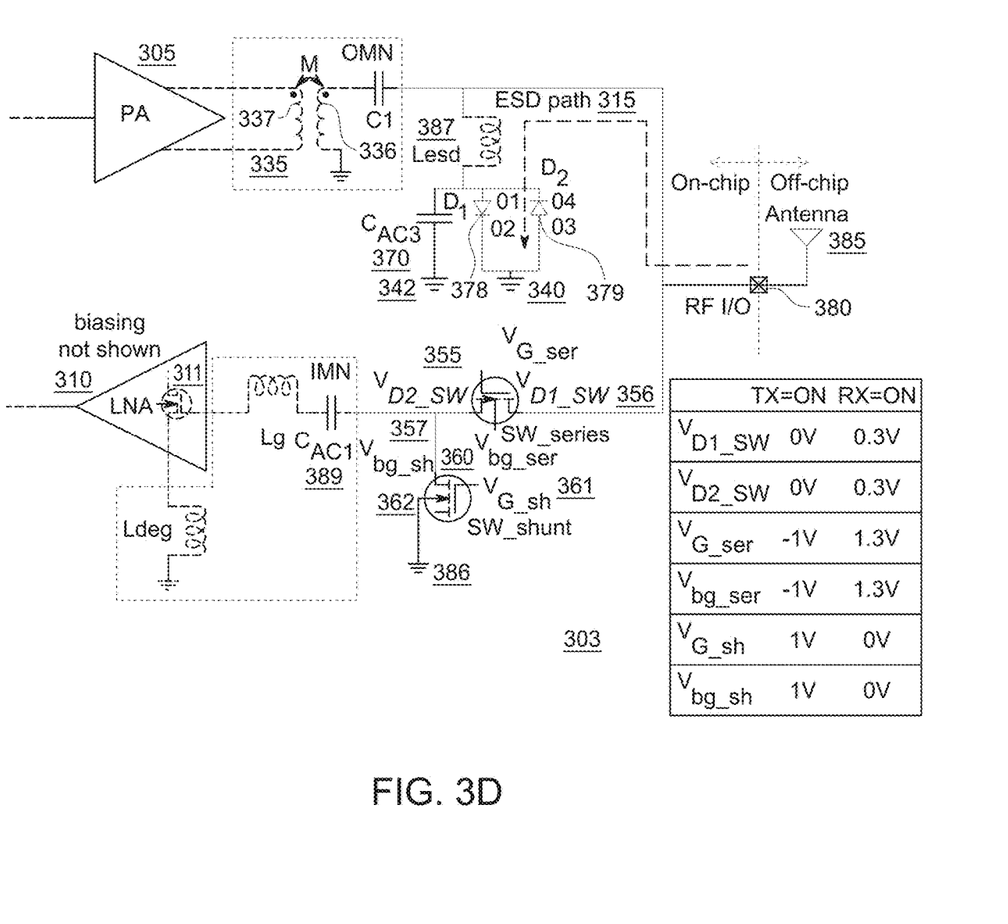
FIG. 3D illustrates a millimeter-wave TRX interface with ESD protection applied to the topology of FIG. 2C, according to an embodiment.
Figure 3E:
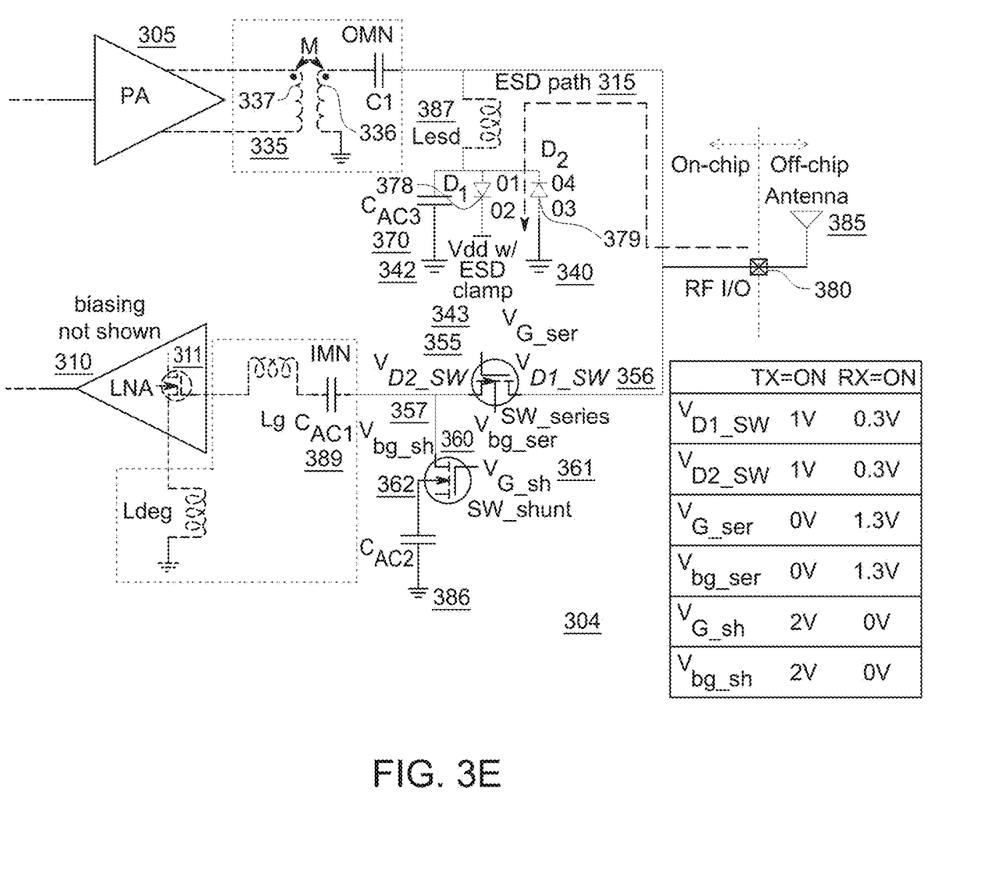
FIG. 3E illustrates a millimeter-wave TRX interface with ESD protection applied to the topology of FIG. 2D, according to an embodiment.
Figure 3F:
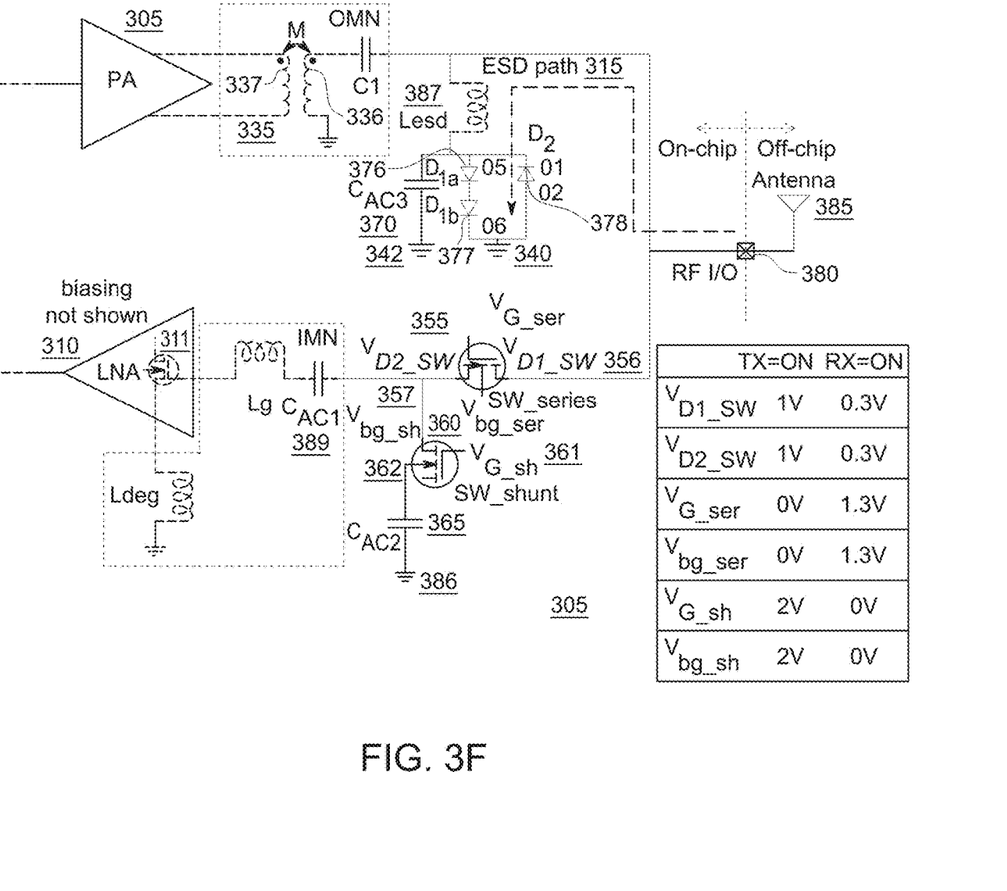
FIG. 3F illustrates a millimeter-wave TRX interface with ESD protection applied to the topology of FIG. 2D, according to an embodiment.

FIG. 3D illustrates a millimeter-wave TRX interface with ESD protection 303 applied to the topology of FIG. 2C, according to an embodiment, FIG. 3E illustrates a millimeter-wave TRX interface with ESD protection 304 applied to the topology of FIG. 2D, according to an embodiment, and FIG. 3F illustrates a millimeter-wave TRX interface with ESD protection 305 applied to the topology of FIG. 2D, according to an embodiment. The same labeling as described above in FIGS. 3A, 3B and 3C applies to FIGS. 3D, 3E and 3F except where additional labeling is provided.

Specifically, FIG. 3D illustrates the embodiment of FIG. 3A applied to the topology of FIG. 2C, with the diodes D1 378 and D2 379 and capacitor $C_{AC3}$ 370 being connected between the shunt inductor $L_{esd}$ 387 and ground instead of between the secondary winding terminal and ground. FIG. 3E illustrates the embodiment of FIG. 3B applied to the topology of FIG. 2D, with diode D2 379 and $C_{AC3}$ 370 being connected between $L_{esd}$ 387 and ground and diode D1 378 being connected between $L_{esd}$ 387 and the Vdd with ESD clamp protection circuitry 343, instead of the same diodes and capacitor between connected between the secondary winding terminal and ground. FIG. 3F illustrates the embodiment of FIG. 3C applied to the topology of FIG. 2D, with the diodes $D_{1a}$ 376, $D_{1b}$ 377, D2 378 and $C_{AC3}$ 370 being connected between $L_{esd}$ 387 and ground instead of between the secondary winding terminal and ground.

The embodiments described above in FIGS. 3A, 3B, and 3C remove the AC coupling capacitor from the critical signal path of a millimeter-wave TRX interfaces 300, 301 and 302 including a transmit front-end, a receive front-end, and a T/R switch. Meanwhile, the embodiments described above in FIGS. 3D, 3E, and 3F relocate the AC coupling capacitor $C_{AC1}$ 389 to outside of the critical signal path of the millimeter-wave TRX interfaces 303, 304 and 305. Doing so improves RF performance of the TRX interface in terms of NF and gain in RX mode, and output power in TX mode since $C_{AC1}$, by being in series with the critical signal path in contrast with $C_{AC2}$ and $C_{AC3}$ which are grounded on one end, degrades the NF and gain of the receiver during the RX mode and reduces output power during the TX mode.

Additionally, the removal of the AC coupling capacitor from critical signal path increases compactness of the core circuitry in the silicon die area since the AC coupling capacitor would otherwise occupy a significant portion of the silicon die area of the TR switch.

Figure 4:
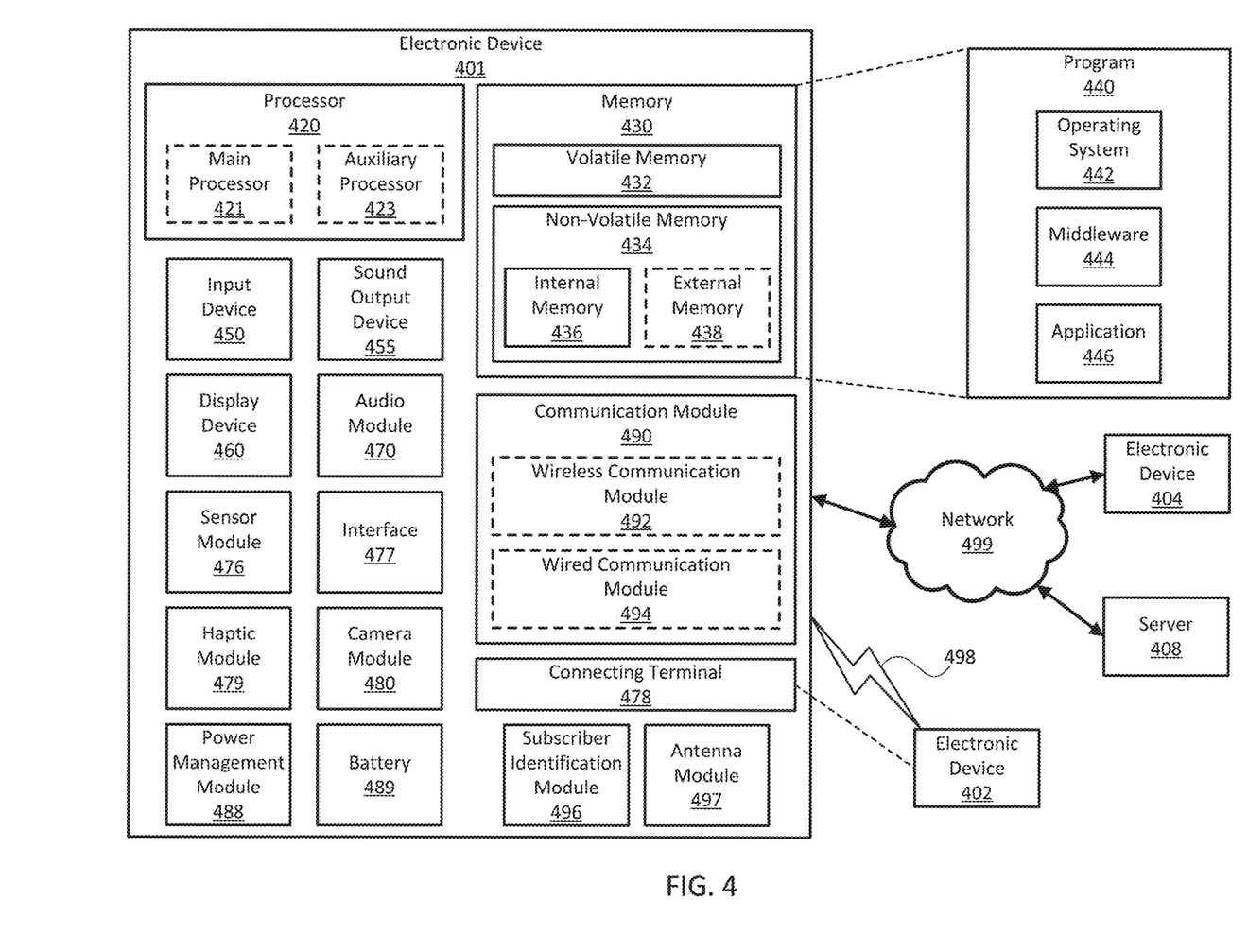
FIG. 4 is a block diagram of an electronic device in a network environment, according to an embodiment.

FIG. 4 is a block diagram of an electronic device in a network environment 400, according to an embodiment.

Referring to FIG. 4, an electronic device 401 in a network environment 400 may communicate with an electronic device 402 via a first network 498 (e.g., a short-range wireless communication network), or an electronic device 404 or a server 408 via a second network 499 (e.g., a long-range wireless communication network). The electronic device 401 may communicate with the electronic device 404 via the server 408. The electronic device 401 may include a processor 420, a memory 430, an input device 440, a sound output device 455, a display device 460, an audio module 470, a sensor module 476, an interface 477, a haptic module 479, a camera module 480, a power management module 488, a battery 489, a communication module 490, a subscriber identification module (SIM) card 496, or an antenna module 494. In one embodiment, at least one (e.g., the display device 460 or the camera module 480) of the components may be omitted from the electronic device 401, or one or more other components may be added to the electronic device 401. Some of the components may be implemented as a single integrated circuit (IC). For example, the sensor module 476 (e.g., a fingerprint sensor, an iris sensor, or an illuminance sensor) may be embedded in the display device 460 (e.g., a display).

The processor 420 may execute software (e.g., a program 440) to control at least one other component (e.g., a hardware or a software component) of the electronic device 401 coupled with the processor 420 and may perform various data processing or computations. For example, the hardware or software component of the electronic device may include any of the millimeter-wave TRX interfaces 300, 301, 302, 303, 304 and 305 disclosed herein.

As at least part of the data processing or computations, the processor 420 may load a command or data received from another component (e.g., the sensor module 446 or the communication module 490) in volatile memory 432, process the command or the data stored in the volatile memory 432, and store resulting data in non-volatile memory 434. The processor 420 may include a main processor 421 (e.g., a central processing unit (CPU) or an application processor (AP)), and an auxiliary processor 423 (e.g., a graphics processing unit (GPU), an image signal processor (ISP), a sensor hub processor, or a communication processor (CP)) that is operable independently from, or in conjunction with, the main processor 421. Additionally or alternatively, the auxiliary processor 423 may be adapted to consume less power than the main processor 421, or execute a particular function. The auxiliary processor 423 may be implemented as being separate from, or a part of, the main processor 421.

The auxiliary processor 423 may control at least some of the functions or states related to at least one component (e.g., the display device 460, the sensor module 476, or the communication module 490) among the components of the electronic device 401, instead of the main processor 421 while the main processor 421 is in an inactive (e.g., sleep) state, or together with the main processor 421 while the main processor 421 is in an active state (e.g., executing an application). The auxiliary processor 423 (e.g., an image signal processor or a communication processor) may be implemented as part of another component (e.g., the camera module 480 or the communication module 490) functionally related to the auxiliary processor 423.

The memory 430 may store various data used by at least one component (e.g., the processor 420 or the sensor module 476) of the electronic device 401. The various data may include, for example, software (e.g., the program 440) and input data or output data for a command related thereto. The memory 430 may include the volatile memory 432 or the non-volatile memory 434. The program 440 may be stored in the memory 430 as software, and may include, for example, an operating system (OS) 442, middleware 444, or an application 446.

The input device 450 may receive a command or data to be used by another component (e.g., the processor 420) of the electronic device 401, from the outside (e.g., a user) of the electronic device 401. The input device 450 may include, for example, a microphone, a mouse, or a keyboard.

The sound output device 455 may output sound signals to the outside of the electronic device 401. The sound output device 455 may include, for example, a speaker or a receiver. The speaker may be used for general purposes, such as playing multimedia or recording, and the receiver may be used for receiving an incoming call. The receiver may be implemented as being separate from, or a part of, the speaker.

The display device 460 may visually provide information to the outside (e.g., a user) of the electronic device 401. The display device 460 may include, for example, a display, a hologram device, or a projector and control circuitry to control a corresponding one of the display, hologram device, and projector. The display device 460 may include touch circuitry adapted to detect a touch, or sensor circuitry (e.g., a pressure sensor) adapted to measure the intensity of force incurred by the touch.

The audio module 470 may convert a sound into an electrical signal and vice versa. The audio module 470 may obtain the sound via the input device 450 or output the sound via the sound output device 455 or a headphone of an external electronic device 402 directly (e.g., wired) or wirelessly coupled with the electronic device 401.

The sensor module 476 may detect an operational state (e.g., power or temperature) of the electronic device 401 or an environmental state (e.g., a state of a user) external to the electronic device 401, and then generate an electrical signal or data value corresponding to the detected state. The sensor module 476 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 477 may support one or more specified protocols to be used for the electronic device 401 to be coupled with the external electronic device 402 directly (e.g., wired) or wirelessly. The interface 477 may include, for example, a high-definition multimedia interface (HDMI), a universal serial bus (USB) interface, a secure digital (SD) card interface, or an audio interface.

A connecting terminal 478 may include a connector via which the electronic device 401 may be physically connected with the external electronic device 402. The connecting terminal 478 may include, for example, an HDMI connector, a USB connector, an SD card connector, or an audio connector (e.g., a headphone connector).

The haptic module 479 may convert an electrical signal into a mechanical stimulus (e.g., a vibration or a movement) or an electrical stimulus which may be recognized by a user via tactile sensation or kinesthetic sensation. The haptic module 479 may include, for example, a motor, a piezoelectric element, or an electrical stimulator.

The camera module 480 may capture a still image or moving images. The camera module 480 may include one or more lenses, image sensors, image signal processors, or flashes. The power management module 488 may manage power supplied to the electronic device 401. The power management module 488 may be implemented as at least part of, for example, a power management integrated circuit (PMIC).

The battery 489 may supply power to at least one component of the electronic device 401. The battery 489 may include, for example, a primary cell which is not rechargeable, a secondary cell which is rechargeable, or a fuel cell.

The communication module 490 may support establishing a direct (e.g., wired) communication channel or a wireless communication channel between the electronic device 401 and the external electronic device (e.g., the electronic device 402, the electronic device 404, or the server 408) and performing communication via the established communication channel. The communication module 490 may include one or more communication processors that are operable independently from the processor 420 (e.g., the AP) and supports a direct (e.g., wired) communication or a wireless communication. The communication module 490 may include a wireless communication module 492 (e.g., a cellular communication module, a short-range wireless communication module, or a global navigation satellite system (GNSS) communication module) or a wired communication module 494 (e.g., a local area network (LAN) communication module or a power line communication (PLC) module). A corresponding one of these communication modules may communicate with the external electronic device via the first network 498 (e.g., a short-range communication network, such as Bluetooth™, wireless-fidelity (Wi-Fi) direct, or a standard of the Infrared Data Association (IrDA)) or the second network 499 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 492 may identify and authenticate the electronic device 401 in a communication network, such as the first network 498 or the second network 499, using subscriber information (e.g., international mobile subscriber identity (IMSI)) stored in the subscriber identification module 496.

The antenna module 497 may transmit or receive a signal or power to or from the outside (e.g., the external electronic device) of the electronic device 401. The antenna module 497 may include one or more antennas, and, therefrom, at least one antenna appropriate for a communication scheme used in the communication network, such as the first network 498 or the second network 499, may be selected, for example, by the communication module 490 (e.g., the wireless communication module 492). The signal or the power may then be transmitted or received between the communication module 490 and the external electronic device via the selected at least one antenna.

Commands or data may be transmitted or received between the electronic device 401 and the external electronic device 404 via the server 408 coupled with the second network 499. Each of the electronic devices 402 and 404 may be a device of a same type as, or a different type, from the electronic device 401. All or some of operations to be executed at the electronic device 401 may be executed at one or more of the external electronic devices 402, 404, or 408. For example, if the electronic device 401 should perform a function or a service automatically, or in response to a request from a user or another device, the electronic device 401, instead of, or in addition to, executing the function or the service, may request the one or more external electronic devices to perform at least part of the function or the service. The one or more external electronic devices receiving the request may perform the at least part of the function or the service requested, or an additional function or an additional service related to the request and transfer an outcome of the performing to the electronic device 401. The electronic device 401 may provide the outcome, with or without further processing of the outcome, as at least part of a reply to the request. To that end, a cloud computing, distributed computing, or client-server computing technology may be used, for example.

While the disclosure has been described with reference to embodiments, various changes may be made without departing from the spirit and the scope of the disclosure, which is defined not by the description and embodiments, but by the appended claims and their equivalents.

What is claimed is:

1. A device, comprising:
a transmitter (TX) front-end;
a receiver (RX) front-end;
a TX/RX switch disposed in series between the TX front-end and the RX front-end;
a TX output transformer disposed between the TX front-end and an input of the TX/RX switch;
a first capacitor;
at least two diodes; and
a shunt switch disposed between the TX/RX switch and ground and having a gate and a back-gate,
wherein the first capacitor and the at least two diodes is connected between the TX output transformer and the ground, and
wherein the first capacitor is connected in parallel with the at least one of the at least two diodes.

2. The device of claim 1,
wherein the device is a millimeter-wave transceiver (TRX) interface.

3. The device of claim 2,
wherein the TRX interface is configured to operate at frequencies of at least 30 gigahertz (GHz).

4. The device of claim 3, further comprising:
a power amplifier (PA) disposed in the TX front-end; and
a low-noise amplifier (LNA) disposed in the RX front-end,
wherein the TX/RX switch is configured to switch between the PA during transmission and the LNA during reception in a time division duplex system.

5. The device of claim 1,
wherein the TX output transformer includes a primary winding terminal and a secondary winding terminal, and
wherein the first capacitor is an alternative current (AC) coupling capacitor.

6. The device of claim 5,
wherein the at least two diodes and the AC coupling capacitor are connected between the secondary winding terminal of the TX output transformer and the ground.

7. The device of claim 6,
wherein the at least two diodes include a first diode and a second diode, and
wherein an anode and a cathode of the first diode are connected to a cathode and an anode of the second diode, respectively.

8. The device of claim 1, further comprising:
a second AC coupling capacitor disposed between the back-gate of the shunt switch and the ground.

9. The device of claim 7,
wherein a cathode of the first diode is connected to a voltage drain with an electrostatic discharge clamp protection circuitry.

10. A chipset, comprising:
a transmitter (TX) front-end;
a receiver (RX) front-end;
a TX/RX switch disposed in series between the TX front-end and the RX front-end;
a TX output transformer disposed between the TX front-end and an input of the TX/RX switch;
a first capacitor;
at least two diodes; and a shunt switch disposed between the TX/RX switch and ground and having a gate and a back-gate, wherein the first capacitor and the at least two diodes is connected between the TX output transformer and the ground, and wherein the first capacitor is connected in parallel with the at least one of the at least two diodes.

11. The chipset of claim 10, wherein the chipset is a millimeter-wave transceiver (TRX) interface.

12. The chipset of claim 11, wherein the TRX interface is configured to operate at frequencies of at least 30 gigahertz (GHz).

13. The chipset of claim 12, further comprising:

a power amplifier (PA) disposed in the TX front-end; and a low-noise amplifier (LNA) disposed in the RX front-end, wherein the TX/RX switch is configured to switch between the PA during transmission and the LNA during reception in a time division duplex system.

14. The chipset of claim 10, wherein the TX output transformer includes a primary winding terminal and a secondary winding terminal, and wherein the first capacitor is an alternative current (AC) coupling capacitor.

15. The chipset of claim 14, wherein the at least two diodes and the AC coupling capacitor are connected between the secondary winding terminal of the TX output transformer and the ground.

16. The chipset of claim 15, wherein the at least two diodes include a first diode and a second diode, and wherein an anode and a cathode of the first diode are connected to a cathode and an anode of the second diode, respectively.

17. The chipset of claim 10, further comprising:

a second AC coupling capacitor disposed between the back-gate of the shunt switch and the ground.

18. The chipset of claim 16, wherein a cathode of the first diode is connected to a voltage drain with an electrostatic discharge clamp protection circuitry.

* * * * *